(12) United States Patent
Jin

(10) Patent No.: US 7,852,019 B2
(45) Date of Patent: Dec. 14, 2010

(54) USING A TRIANGULAR WAVEFORM TO SYNCHRONIZE THE OPERATION OF AN ELECTRONIC CIRCUIT

(75) Inventor: Xiaoping Jin, Orange, CA (US)

(73) Assignee: MICROSEMI Corporation, Garden Grove, CA (US)

( * ) Notice: Subject to any disclaimer, the term of this patent is extended or adjusted under 35 U.S.C. 154(b) by 529 days.

(21) Appl. No.: 11/955,477

(22) Filed: Dec. 13, 2007

(65) Prior Publication Data

US 2009/0154543 A1 Jun. 18, 2009

(51) Int. Cl.
*H05B 37/02* (2006.01)
(52) U.S. Cl. .................. 315/307; 315/291; 327/116
(58) Field of Classification Search .......... 315/246, 315/291, 307, 224–226, 247, 209 R, 294, 315/299, 300, 308; 327/112–116, 119, 131, 327/134–136, 172, 175
See application file for complete search history.

(56) References Cited

U.S. PATENT DOCUMENTS

| 3,723,907 | A | | 3/1973 | Tajchman et al. | |
|---|---|---|---|---|---|
| 4,179,727 | A | | 12/1979 | Muto et al. | |
| 4,498,138 | A | * | 2/1985 | Moore | 702/60 |
| 5,500,575 | A | * | 3/1996 | Ionescu | 315/307 |
| 5,615,093 | A | | 3/1997 | Nalbant | |
| 5,923,129 | A | | 7/1999 | Henry | |
| 6,836,103 | B2 | | 12/2004 | Brooks et al. | |
| 7,005,835 | B2 | | 2/2006 | Brooks et al. | |
| 7,064,497 | B1 | * | 6/2006 | Hsieh | 315/246 |
| 7,081,741 | B2 | | 7/2006 | Ishii et al. | |
| 7,212,045 | B2 | | 5/2007 | Hsu et al. | |
| 7,224,196 | B2 | | 5/2007 | Fukumoto | |
| 7,233,509 | B2 | | 6/2007 | Fukumoto | |
| 7,317,444 | B2 | * | 1/2008 | Chang | 345/102 |
| 7,332,898 | B1 | | 2/2008 | Harrison et al. | |
| 7,477,024 | B2 | * | 1/2009 | Lin et al. | 315/307 |
| 2007/0103138 | A1 | | 5/2007 | Tago | |

FOREIGN PATENT DOCUMENTS

WO 2007031840 A1 3/2007

* cited by examiner

*Primary Examiner*—Jacob Y Choi
*Assistant Examiner*—Jimmy T Vu
(74) *Attorney, Agent, or Firm*—Simon Kahn

(57) ABSTRACT

An electronic circuit exhibiting synchronization with an external synchronization signal, the electronic circuit comprising: an input connection arranged to receive a synchronization input signal; a triangular waveform oscillator operatively associated with the synchronization signal input connection and responsive to a condition of the received synchronization input signal to initiate a triangular waveform; and a pulse train generator operatively associated with the triangular waveform oscillator, the pulse train generator arranged to generate a plurality of pulse trains having a fixed non-zero phase relationship between them and a frequency responsive to the condition of the synchronization input signal.

19 Claims, 6 Drawing Sheets

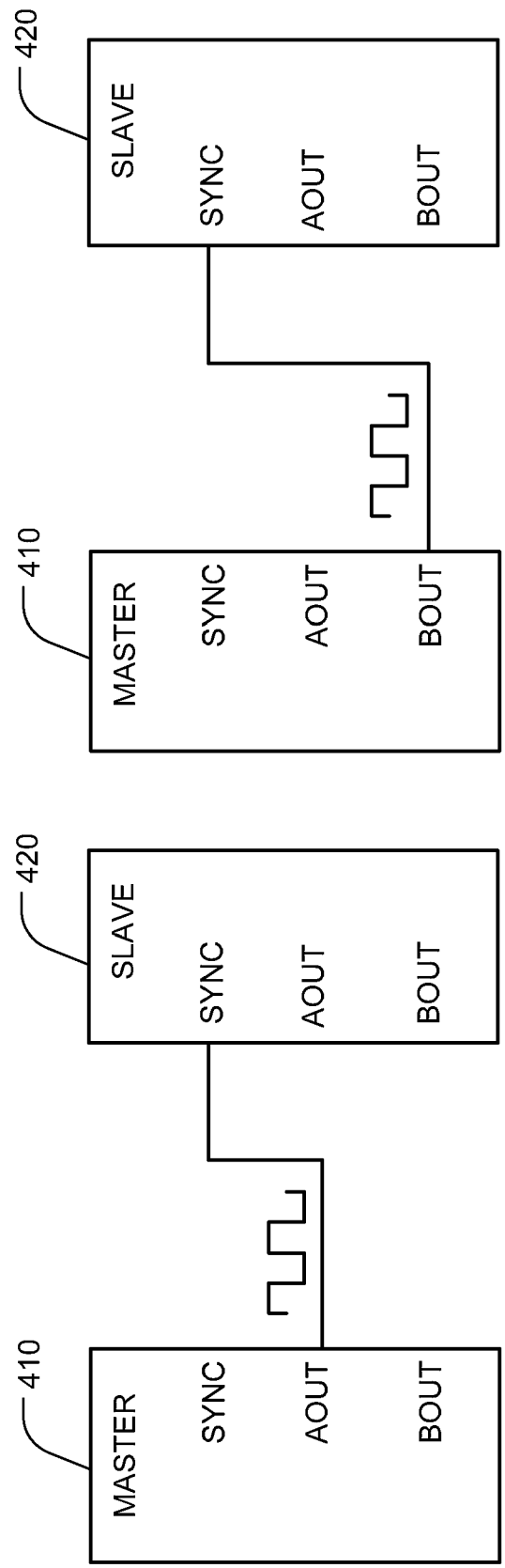

USING A TRIANGULAR WAVEFORM TO SYNCHRONIZE THE OPERATION OF AN ELECTRONIC CIRCUIT

TECHNICAL FIELD

The present invention relates to synchronization of disparate electronic circuits, and more particularly, to synchronization of a plurality of phased signals to an external synchronization input.

BACKGROUND OF THE INVENTION

Cold Cathode Fluorescent Lamps (CCFL) are extensively used today as backlights for computer liquid crystal displays (LCD) and LCD televisions. CCFL lamps are typically driven in a push pull configuration such that current flows alternatively in each direction to ensure long life and uniform operation. A CCFL driver thus must provide a pair of complementary drive signals which are out of phase with each other. Typically, a CCFL driver requires a pair of driving signals which are 180° out of phase with each other, however this is not meant to be limiting in any way and 90° phase difference is also required in some particular applications.

Systems that use a plurality of CCFL lamps for a single display require synchronization between the CCFL drivers so as to avoid interference caused by non-synchronized operation. Further synchronization is often required with a system display signal, such as a video scanning signal, associated with a horizontal scanning frequency, so as to avoid a water wave effect. Such synchronization is required for single and multiple CCFL driver systems.

U.S. Pat. No. 5,615,093 issued Mar. 25, 1997 to Nalbant, the entire contents of which is incorporated herein by reference, is addressed to a power converter circuit for driving a CCFL lamp comprising a controller circuitry. The controller circuitry includes an oscillator capable of self synchronizing to the resonant frequency of the components, and exhibits a sawtooth timing circuit for the oscillator. The clock frequency driving the CCFL is half the frequency of the sawtooth timing circuit. Thus, in order to synchronize a plurality of CCFL controller circuits of the type described by Nalbant, a clock signal double the driving frequency must be propagated or a frequency doubler circuit provided thereby allowing for synchronization from the CCFL driving output.

U.S. Pat. No. 5,923,129 issued Jul. 13, 1999 to Henry, the entire contents of which is incorporated herein by reference, is addressed to a power conversion circuit driving a CCFL. The clock oscillating circuit operates at twice the frequency of the direct drive network and provides the fundamental frequency of operation. Thus, in order to synchronize a plurality of CCFL controller circuits of the type described by Henry, a clock signal double the driving frequency must be propagated, or a frequency doubler circuit provided, thereby allowing for synchronization from the CCFL driving output.

In order to synchronize a plurality of CCFL controller circuits among themselves and/or with a video horizontal scanning frequency, a plurality of connections is typically required including a synchronization signal, a phase signal, and a connection indicating if the CCFL controller circuit is a master or slave. If the operating frequency of the CCFL controller circuit is to be equal to the video horizontal scanning frequency, a frequency doubler is also required since, as described above, the clock is typically double the operating frequency.

These additional circuitry and pins will inevitably increase the complexity and cost of the controller IC or the inverter control circuit.

SUMMARY OF THE INVENTION

Accordingly, it is a principal object of the present invention to supply a method and system for synchronizing one or more electronic circuits with an external synchronizing signal. In one embodiment a triangular waveform generator is provided, initiated by a condition of the external synchronizing signal. A pulse train generator receives the triangular waveform and generates a plurality of pulse trains exhibiting a non-zero phase difference there between, the plurality of pulse trains being synchronized to the external synchronizing signal. Optionally, a pulse width modulation (PWM) signal is further received and modulates each of the plurality of pulse trains thereby generating a plurality of synchronized modulated pulse trains with a non-zero phase difference there between.

In one particular embodiment the synchronizing circuit comprises: a triangular waveform oscillator operatively associated with a pulse train generator that is operatively associated with a signal modulator. The triangular waveform oscillator is initiated by a synchronization signal. The pulse train generator is configured to generate two pulse trains synchronized with the synchronization signal and having a 180 degrees phase shift between them. The pulse trains preferably exhibit a frequency associated with one of the synchronization signal and the triangular waveform oscillator. The signal modulator is configured to modulate an incoming signal on the pulse trains resulting in an output signal exhibiting two phases synchronized with the synchronization signal.

In one embodiment, the use of a triangular waveform is used as a master clock signal in a CCFL controller circuit. The triangular waveform is configured such that its frequency is less than, but close to, the frequency of the synchronization signal. The triangular waveform contains the information required to generate a plurality of pulse trains having a fixed non-zero phase difference between them. Preferably, the non-zero phase difference is about 180°. A modulation circuit is preferably further provided arranged to modulate the pulse trains with a PWM signal thereby generating two out of phase outputs modulated by the PWM signal.

Thus, less wiring required and specifically in an integrated circuit (IC) implementation the pin count is reduced—because there is no need to deliver the phase information separately. Since the triangular waveform may have the same frequency of the clock instead half of the frequency as in the traditional saw tooth waveform, the use of a frequency doubler is eliminated, thus saving wafer space.

Advantageously, the circuit according to the disclosure may be used in some embodiments in CCFL implementation, but is not limited thereto.

BRIEF DESCRIPTION OF THE DRAWINGS

The subject matter regarded as the invention will become more clearly understood in light of the ensuing description of embodiments herein, given by way of example and for purposes of illustrative discussion of the present invention only, with reference to the accompanying drawings (Figures, or simply "FIGS."), wherein:

FIGS. 4A-4E show a variety of different configurations of the synchronization circuit according to some embodiments when used as a part of a larger system.

Figure 1:
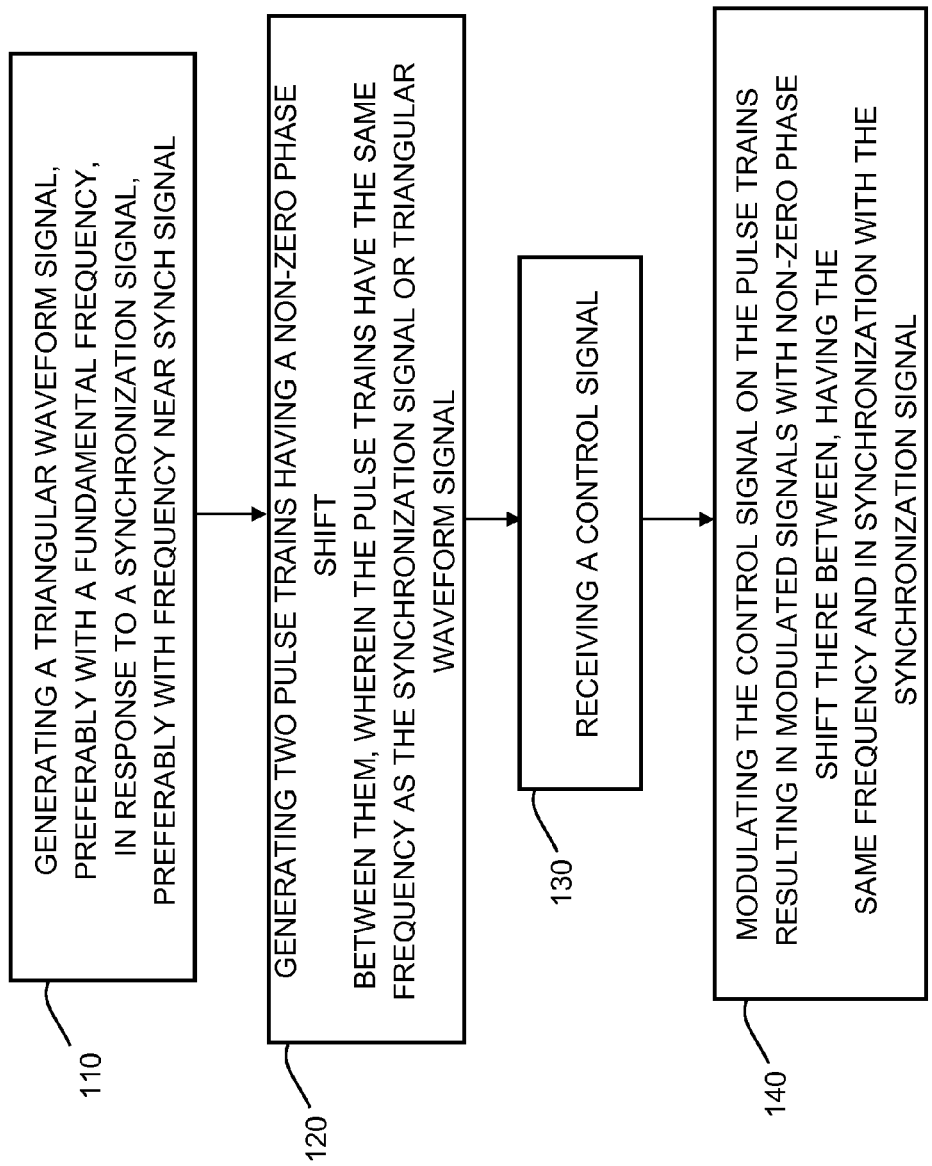
FIG. 1 is a flowchart showing the stages of the method according to some embodiments of the disclosure.

The drawings together with the description make apparent to those skilled in the art how the invention may be embodied in practice.

In electronic circuit diagrams, conventional electronic components are labeled with conventional reference letters followed by a number indication the iteration of that element in the circuit. For example, R indicates a resistor, C indicates a capacitor, A indicates an amplifier (that may be configured in several ways such as a comparator, differential amplifier and the like) and M indicates a Metal Oxide Substrate Field Effect Transistor (MOSFET). Each electronic component has a plurality of terminals (inputs and outputs) through which it is connected to wires and other components. However the use of the word 'terminal', 'input' or 'output' does not imply an implementation based on discrete components only, and any circuit described may be implemented as an integrated circuit (IC). Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

According to some embodiments, the synchronization method may be incorporated into a CCFL controller. This implementation may be particularly effective for the TV market as well as monitors and thin displays.

FIG. 1 is a flowchart showing the stages of the method according to some embodiments of the disclosure. Stage 110 is generating a triangular waveform signal in response to a synchronization signal, which preferably exhibits a periodic frequency. The triangular waveform signal preferably exhibits a fundamental frequency, which is preferably less than, but near, the periodic frequency of the synchronization signal. Stage 120 is generating a plurality of pulse trains having a fixed non-zero phase relationship between the pulse trains, preferably a 180 degree phase shift. The pulse trains exhibit one of the fundamental frequency of the triangular waveform and the periodic frequency of the synchronization signal. Preferably, provided that the synchronization signal is present, the pulse trains exhibit the periodic frequency of the synchronization signal. Stage 130 is receiving a control signal, preferably a PWM signal. Stage 140 is modulating the received control signal on the plurality of pulse trains of stage 120, resulting in two modulated pulse trains synchronized with the synchronization signal and having a fixed non-zero phase relationship.

Figure 2:
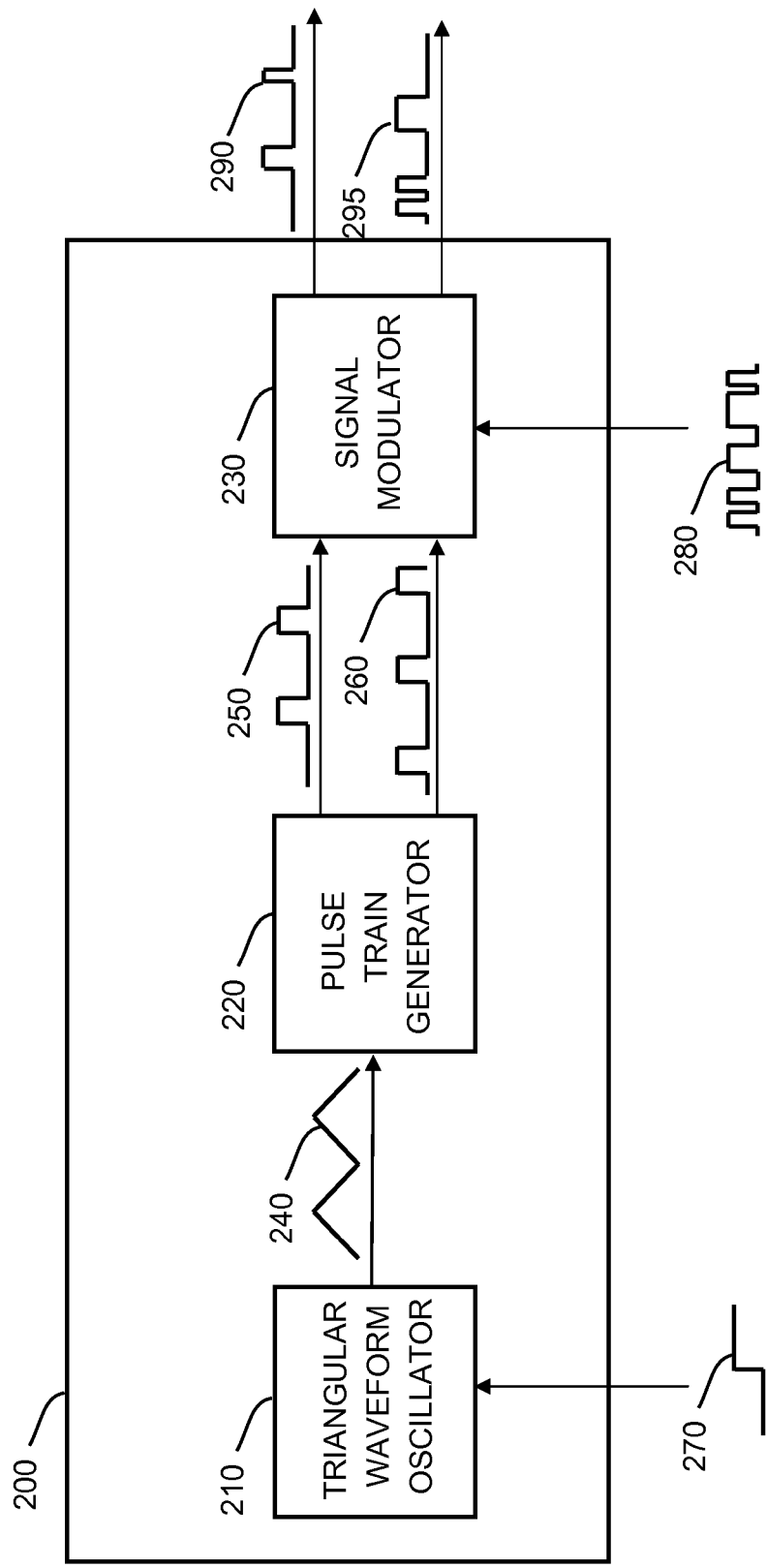
FIG. 2 is a schematic block diagram of the synchronization circuit according to some embodiments of the disclosure.

FIG. 2 is a schematic block diagram of a portion of an electronic circuit exhibiting a synchronization circuit according to some embodiments of the disclosure. The block diagram shows a synchronization circuit 200 using a triangular waveform 240. The synchronization circuit 200 comprises a triangular waveform oscillator 210, outputting triangular waveform 240, which is connected to a pulse train generator 220. The output of pulse train generator 220, comprising a first pulse train 250 and a second pulse train 260, is connected to a signal modulator 230. Triangular waveform oscillator 210 is initiated by a condition of a synchronization signal 270, and is preferably responsive to an edge of synchronization signal 270. Synchronization signal 270 is preferably periodic and exhibits a frequency. Preferably the frequency of triangular waveform oscillator 210 is less than, but near, the frequency of synchronization signal 270.

In response to triangular waveform 240, pulse train generator 220 generates a plurality of pulse trains having a non-zero phase shift between them and having the same frequency as one of triangular waveform oscillator 210 and synchronization signal 270. In a preferred embodiment, synchronization signal 270 is periodic with a frequency slightly greater than the fundamental frequency of triangular waveform oscillator 210, and thus the pulse trains exhibit the frequency of synchronization signal 270. In an exemplary embodiment two pulse trains, i.e. first pulse train 250 and second pulse train 260, 180° out of phase with each other, are generated. First pulse trains 250 and 260 are synchronized with the condition of synchronization signal 270. Signal modulator 230 is operative to modulate an incoming signal 280, which if preferably PWM signal, on to the pulse trains. This results in two phases 290 and 295 of the PWM signal, each having the same steering frequency, and synchronized with synchronization signal 270.

Figure 3:
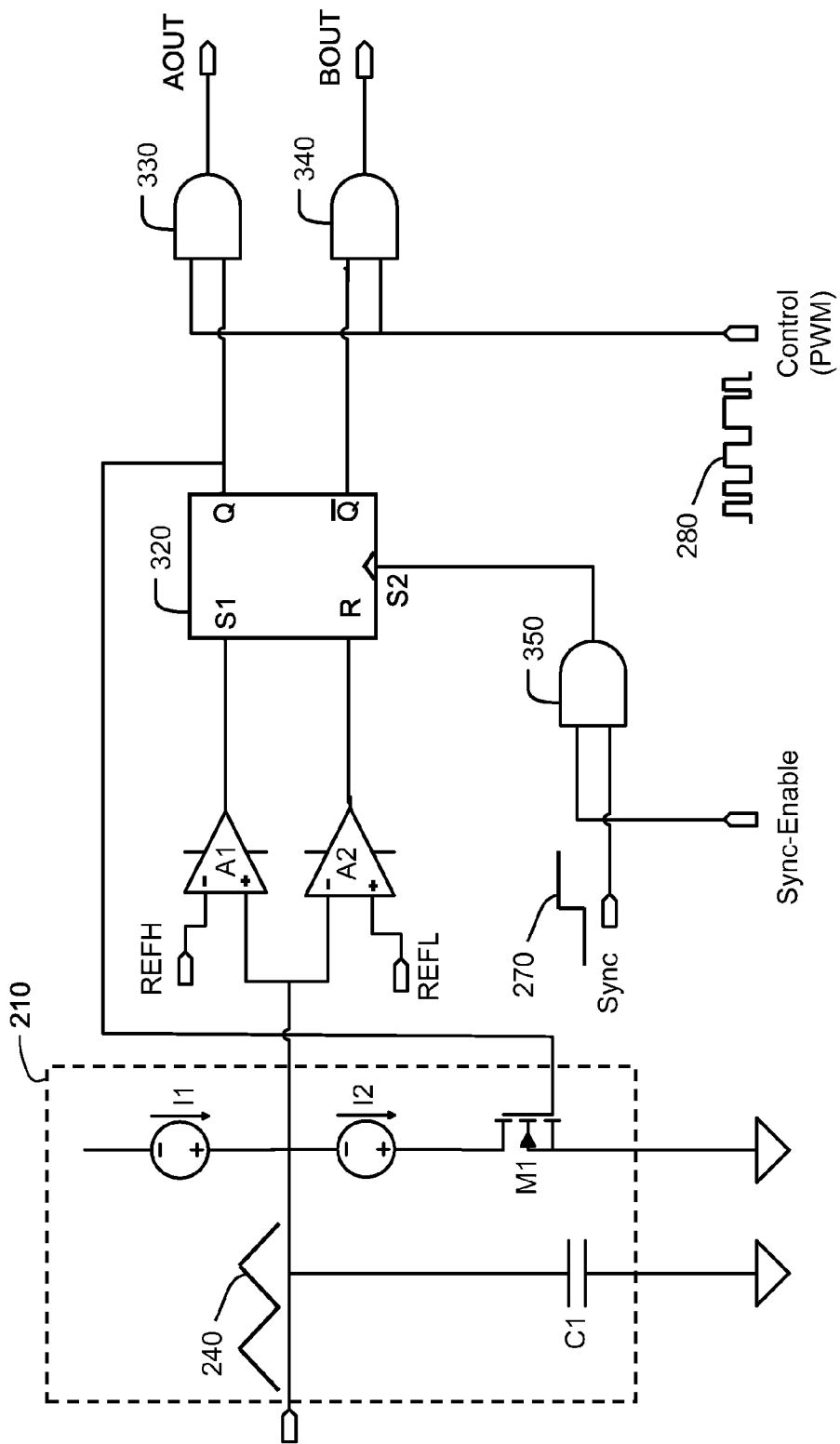
FIG. 3 is schematic electronic circuit diagram of the synchronization circuit according to some embodiments of the invention.

FIG. 3 illustrates a simplified circuit diagram of the implementation of the synchronization circuit according to an embodiment of the invention. The circuit represents one of many possible implementations of synchronization circuit 200 of FIG. 2 and should not be regarded as limiting other embodiments in any way.

The synchronization circuit comprises a triangular waveform oscillator 210 generating a triangular waveform 240. Triangular waveform 240 is characterized by nearly symmetrical rising and falling slopes, ideally having a linear form. According to a non-limiting example, triangular waveform oscillator 210 is implemented by charging and discharging a capacitor C1 by a current source. In the illustrated embodiment, capacitor constant current source I1 is charged by a constant current source I1 and discharged by a constant current source I2 via an N-channel MOSFET transistor M1 to ground. Constant current source I1 and constant current source I2 are preferably of identical amplitude.

Triangular waveform 240 is fed into a first comparator A1 and a second comparator A2. Specifically, triangular waveform 240 is fed into the positive input of comparator A1 and to the negative input of comparator A2. The negative input of comparator A1 is fed with a logic "High" reference signal (REFH) whereas the positive input of comparator A2 is fed with a logic "Low" reference signal (REFL). Thus, comparator A1 is configured to detect the peak point of the triangular waveform, whereas comparator A2 is configured to detect the valley point of the triangular waveform.

The output of comparator A1 is connected to the SET input of an RS flip-flop 320, and the output of the comparator A2 is connected in turn to the RESET input of RS flip-flop 320. Synchronizing signal 270 is fed into the first input of an AND gate 350, while a synchronizing Sync-Enable signal 370 is fed to the second input of AND gate 350. The output of the AND gate 350 is connected to an additional SET input of RS flip-flop 320, which is preferably edge triggered. The Q output of RS flip flop 320 is fed back to the gate of N-channel MOSFET transistor M1 of triangular waveform oscillator 210.

The positive Q output of RS flip flop 320 is further connected to a first input of an AND gate 330. The negative Q output of RS flip flop 320 is connected to a first input of an AND gate 340. A PWM control signal 280 is fed into the second input of AND gate 330 and to the second input of AND gate 340 respectively.

In operation, Sync-Enable signal 370, enables over-ride of the synchronization and is preferably from a control system. In the event that Sync-Enable signal 370 is active, thus allowing for synchronization, synchronizing signal 270 is passed through AND gate 350 and appears at the second Set input of RS flip-flop 320. Second Set input of RS flip-flop 320 is preferably edge triggered, as described above, and thus when a positive going edge of synchronizing signal 270 is presented at second Set input of RS flip-flop 320, RS flip-flop 320 is set and the positive Q output of RS flip-flop 320 becomes active which switches on MOSFET M1 causing capacitor C1 to discharge through current source I2 and initiates the falling slope of triangle waveform 240. Thus, the edge of synchronizing signal 270 initiates the falling slope of triangle waveform 240.

When comparator A2 detects the valley point of triangular waveform 240, i.e. triangular waveform 240 is more negative than REFL, the output of comparator A2 goes positive thereby resetting RS flip flop 320. It is to be understood that the output of comparator A1 is low, since the valley point of triangular waveform 240 is more negative than REFH. Consequently a logic "Low" appears on the positive Q output of RS flip flop 320, and a logic "High" on the negative Q output of RS flip-flop 320. The logic "Low" on the positive Q output of RS flip flop 320 turns off MOSFET transistor M1 thus enabling the charging of capacitor C1 by constant current source I1, and thereby initiating the rising slope of triangular waveform 240. In the event another condition of synchronizing signal 270 is not received, comparator A1 will detect the peak point of triangular waveform 240, and reset RS flip flop 320 to output a logic "High" at the positive Q output.

Thus the positive Q output is positive responsive to a condition of synchronizing signal 270, and the negative Q output is positive responsive to ½ the fundamental cycle time of triangular waveform oscillator 210. Thus, the output of RS flip-flop 320 exhibit two pulse trains having a 180 degree phase shift between them and a frequency responsive to one of triangular waveform oscillator 210 and synchronizing signal 270. Notably, the pulse trains have the same frequency as the triangular waveform oscillator 210 instead of half of it. Such pulse trains are the base signal of the contemporary double-ended switching power converter topology, preferably utilized to drive a CCFL lamp load.

These pulse trains are then used by AND gates 330 and 340 in the configuration depicted above to generate the two phase outputs of PWM control signal 280. Thus, the output of AND gate 330, denoted AOUT, exhibits PWM control signal 280 when the positive Q output of RS flip-flop 320 is positive, and the output of AND gate 340, denoted BOUT, exhibits PWM control signal 280 when the negative Q output of RS flip-flop 320 is positive. These two modulated PWM control signals exhibit a fixed phase relationship, are synchronized with synchronization signal 270 and exhibit a frequency reflective thereof, or reflective of the frequency of triangular waveform oscillator 210.

According to some embodiments, synchronization signal 270 may be of any type of pulse as long as its amplitude meets the high-low logic signal level requirements of the AND gate 350, and the state duration is sufficient for the set/reset time requirement of the RS flip-flop 320. Sync-Enable signal 370 of the AND gate 350 is driven from a timing circuit of a control system (not shown) that may disable the synchronization function when it is not required.

Figures 4C, 4D:
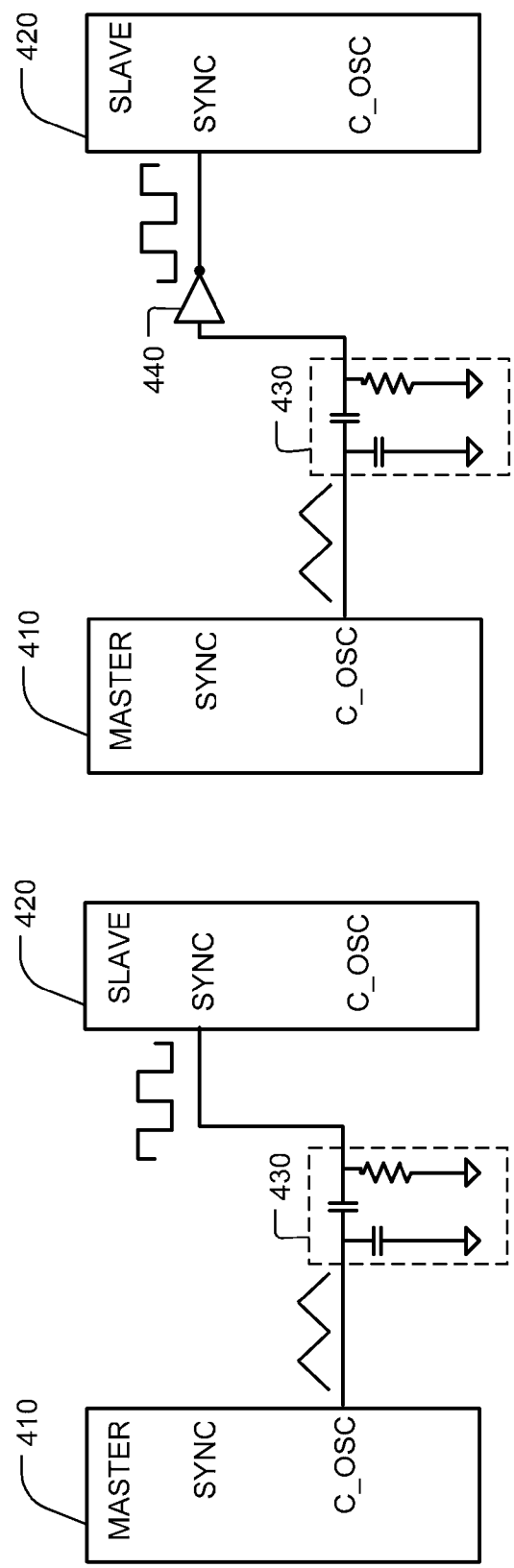

FIGS. 4A-4E exhibit a plurality of electronic components in accordance with an embodiment of the invention, in which synchronization is easily and simply accomplished with a minimum of connection. FIG. 4A is an electronic circuit diagram showing two inverter controllers, specifically a master controller 410 and a slave controller 420, implementing synchronization in accordance with an embodiment of the invention. The controllers are synchronized to exhibit in-phase operation by connecting AOUT of master controller 410 to the SYNC input of slave controller 420. It is to be understood, that in the event a PWM signal is modulated on AOUT, an appropriate filter is required at the SYNC input to slave controller 420 to recover the original phases of the outputs of RS flip-flop 320. Since AOUT of slave controller 420 is synchronized with the positive going edge of AOUT of master controller 410, the outputs of master controller 410 and slave controller 420 will be in phase.

In FIG. 4B, output BOUT of master controller 410 is connected to the SYNC input of salve controller 420, and thus slave controller 420 is 180° out of phase with master controller 410. It is to be understood, that in the event a PWM signal is modulated on BOUT, an appropriate filter is required at the SYNC input to slave controller 420 to recover the original phases of the outputs of RS flip-flop 320. Since AOUT of slave controller 420 is synchronized with the positive going edge of BOUT of master controller 410, the outputs of master controller 410 and slave controller 420 will be 180° out of phase.

The inter-inverter synchronization signal can also be derived from the triangle waveform of triangular waveform oscillator 210 directly as illustrated in FIG. 4C and FIG. 4D. An RC circuit 430 as shown in FIG. 4C and FIG. 4D derives a square wave signal from the triangle waveform. Similarly, a pre-determined phase relationship between master controller 410 and slave controller 420 may be implemented by delaying the triangular waveform or adjusting the points of conversion to a square wave.

In-phase operation can be achieved by inverting the square wave derived from the triangular waveform using an inverter 440 for the derived signal and applying the inverted signal to the SYNC input of slave controller 420 as shown in FIG. 4D. Similarly, anti-phase operation will be realized by connecting the derived square wave signal to the SYNC terminal directly as shown in FIG. 4C, since the rising edge of the triangular waveform is 180° out of phase with the AOUT output of master controller 410.

Figure 4E:
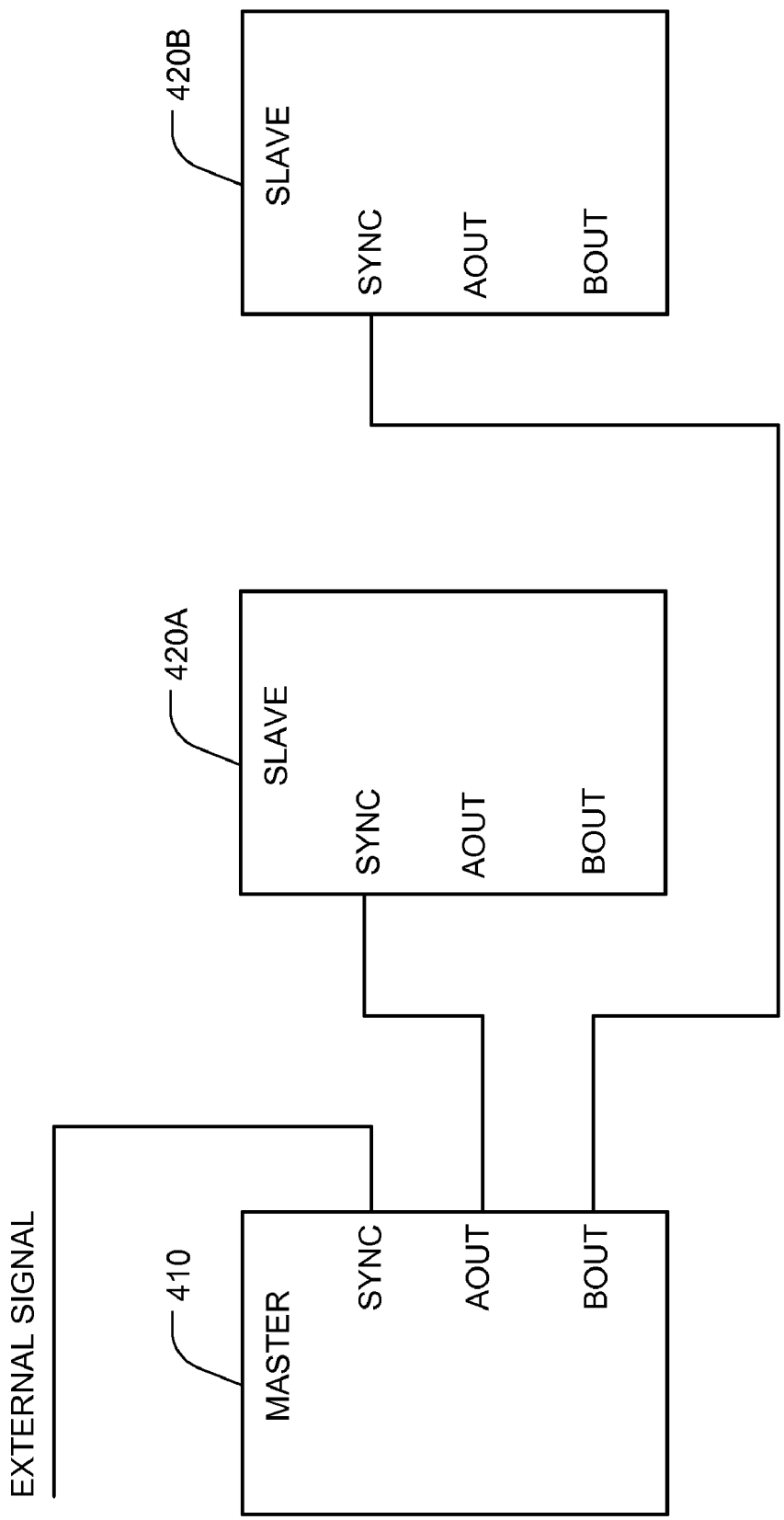

FIG. 4E shows a configuration with external synchronization signal from the display system. Here one controller works as master controller 410 to receive the system SYNC signal and to synchronize itself with the system frequency. The other controllers 420A and 420B work in slave mode and receive SYNC signals from the master via the AOUT and BOUT outputs, respectively, with the operating phase relations and frequency defined by the input SYNC signal. In particular controller 420A is in phase with master controller 410, and controller 420B is 180° out of phase with master controller 410. It should be mentioned that in the above described synchronization operation the natural oscillation frequency of the slave inverter controllers, which receive a synchronization signal at its SYNC input, should be set slightly lower than the master signal frequency, and any PWM component of AOUT and BOUT should be filtered prior to inputting to the respective SYNC input.

Advantageously, the synchronization circuit and the synchronization method described in the disclosure may be effectively applied to any kind of multi-inverter operations where the frequency or phase of the inverters needs to be synchronized either internally among them or externally with an external synchronizing signal.

Any publications, including patents, patent applications and articles, referenced or mentioned in this specification are herein incorporated in their entirety into the specification, to the same extent as if each individual publication was specifically and individually indicated to be incorporated herein. In addition, citation or identification of any reference in the description of some embodiments of the invention shall not be construed as an admission that such reference is available as prior art to the present invention.

While the invention has been described with respect to a limited number of embodiments, these should not be construed as limitations on the scope of the invention, but rather as exemplifications of some of the preferred embodiments. Those skilled in the art will envision other possible variations, modifications, and applications that are also within the scope of the invention. Accordingly, the scope of the invention should not be limited by what has thus far been described, but by the appended claims and their legal equivalents.

What is claimed is:

1. A method of synchronizing the operation of at least one electronic circuit, the method comprising:
    generating a triangular waveform signal responsive to a synchronization signal, said triangular waveform signal exhibiting a fundamental first frequency, said synchronization signal exhibiting a second frequency;
    generating a plurality of pulse trains having a fixed non-zero phase relationship between them, wherein said pulse trains exhibit one of said first frequency and said second frequency; and
    modulating a received control signal with said generated plurality of pulse trains to generate a plurality of modulated pulse trains exhibiting said fixed non-zero phase relationship and a synchronization with the synchronization signal.

2. The method of claim 1, wherein the received control signal comprises a pulse width modulation (PWM) signal.

3. The method of claim 1, wherein the at least one electronic circuit is a cold cathode fluorescent lamp controller.

4. The method of claim 1, wherein said plurality of pulse trains comprise two pulse trains and wherein said fixed phase relationship is 180° out of phase.

5. The method of claim 1, wherein the synchronization signal is a function of a modulated pulse train of another at least one electronic circuit.

6. The method of claim 1, wherein the synchronization signal is a video scan synchronization signal.

7. The method of claim 1, wherein said generating a triangular waveform comprises alternatively charging and discharging a capacitor with at least one current source.

8. The method of claim 1, wherein said generating a triangular waveform comprises alternatively charging a capacitor with a first current source and discharging the capacitor with a second current source.

9. The method of claim 1, wherein said first frequency is less than said second frequency, and wherein said generated plurality of modulated pulse trains exhibit said second frequency.

10. The method of claim 1, wherein said first frequency is less than said second frequency, said generated plurality of modulated pulse trains exhibit said second frequency, said plurality of pulse trains comprise two pulse trains and said fixed phase relationship is 180° out of phase.

11. An electronic circuit exhibiting synchronization comprising:
    an input connection arranged to receive a synchronization input signal;
    a triangular waveform oscillator operatively associated with said synchronization signal input connection and responsive to a condition of said received synchronization input signal to initiate a triangular waveform;
    a pulse train generator operatively associated with said triangular waveform oscillator, said pulse train generator arranged to generate a plurality of pulse trains having a fixed non-zero phase relationship between them and a frequency substantially equivalent to one of the free running frequency of said triangular waveform oscillator and the frequency of the received synchronization input signal; and
    a signal modulator operatively associated with said pulse train generator and arranged to generate a plurality of modulated pulse trains exhibiting said fixed non-zero phase relationship and said frequency responsive to said condition of said synchronization input signal.

12. An electronic circuit according to claim 11, wherein said signal modulator is arranged to receive a pulse width modulated signal and modulate each of said plurality of pulse trains with said received pulse width modulated signal.

13. An electronic circuit according to claim 11, wherein said received synchronization input signal is a function of a modulated pulse train of another electronic circuit according to claim 11.

14. An electronic circuit according to claim 11, wherein the electronic circuit is a cold cathode fluorescent lamp controller.

15. An electronic circuit according to claim 11, wherein said plurality of pulse trains comprise two pulse trains and wherein said fixed phase relationship is 180° out of phase.

16. An electronic circuit according to claim 11, wherein the received synchronization input signal is a video scan synchronization signal.

17. An electronic circuit according to claim 11, wherein said triangular waveform oscillator comprises at least one current source arranged to alternatively charge and discharge a capacitor.

18. An electronic circuit according to claim 11, wherein said triangular waveform oscillator comprises a first current source and a second current source arranged to alternatively charge and discharge a capacitor.

19. An electronic circuit according to claim 11, wherein said frequency of said plurality of pulse trains is substantially equivalent to the frequency of the received synchronization input signal.

* * * * *